United States Patent [19]

Ito

[11] Patent Number: 5,618,755
[45] Date of Patent: Apr. 8, 1997

[54] METHOD OF MANUFACTURING A POLYCIDE ELECTRODE

[75] Inventor: Naoki Ito, Kawasaki, Japan

[73] Assignee: Fuji Electric Co., Ltd., Kawasaki, Japan

[21] Appl. No.: 437,385

[22] Filed: May 9, 1995

[30] Foreign Application Priority Data

May 17, 1994 [JP] Japan .................................. 6-101451

[51] Int. Cl.$^6$ .................................................. H01L 21/28
[52] U.S. Cl. ........................ 438/592; 438/595; 438/655; 438/664
[58] Field of Search ................................. 437/193, 233, 437/967, 200, 247

[56] References Cited

U.S. PATENT DOCUMENTS

| | | | |
|---|---|---|---|
| 5,135,886 | 8/1992 | Manocha et al. | 437/233 |
| 5,190,888 | 3/1993 | Schwalke et al. | 437/193 |
| 5,422,311 | 6/1995 | Woo | 437/193 |
| 5,441,904 | 8/1995 | Kim et al. | 437/193 |
| 5,472,896 | 12/1995 | Chen et al. | 437/192 |
| 5,510,296 | 4/1996 | Yen et al. | 437/193 |

FOREIGN PATENT DOCUMENTS

| | | |
|---|---|---|
| 57-042148 | 3/1982 | Japan . |
| 59-094437 | 5/1984 | Japan . |
| 63-169743 | 7/1988 | Japan . |
| 64-33944 | 2/1989 | Japan . |
| 01112755 | 5/1989 | Japan . |
| 2-54583 | 2/1990 | Japan . |
| 5-166937 | 7/1993 | Japan . |

Primary Examiner—John Niebling
Assistant Examiner—Thomas G. Bilodeau
Attorney, Agent, or Firm—Kanesaka & Takeuchi

[57] ABSTRACT

In a method of the invention, a semiconductor device is manufactured. A partially poly-crystalline silicon thin film is formed on a substrate by a CVD method at a film formation temperature of 550° C. or lower by using a source gas containing silane. Then, a metal silicide film is formed on the silicon thin film at a film formation temperature of 500° C. or lower to form a film lamination. After patterning and etching the film lamination, the film lamination is heat treated and simultaneously crystallized to integrally bond the film lamination.

10 Claims, 3 Drawing Sheets

METHOD OF MANUFACTURING A POLYCIDE ELECTRODE

BACKGROUND OF THE INVENTION AND RELATED ART STATEMENT

The present invention relates to a method of manufacturing a semiconductor device, and more specifically relates to a method for forming an electrode and its protection film on the semiconductor device.

In semiconductor devices, a poly-crystalline silicon film is widely used as an electrode material, gate electrode material and wiring material (hereinafter collectively referred to as "electrode material"). Recently, an electrode material with lower resistivity has been required due to needs for semiconductor devices with higher speed and lower power consumption. To meet the requirement, a film lamination (hereinafter referred to as "polycide film") comprised of a poly-crystalline silicon film and a metal silicide film with high melting point has been used very often. FIGS. 3(a)–3(f) shows a manufacturing method for a semiconductor device according to the prior art by way of sectional views. In FIGS. 3(a)–3(f), each sectional view corresponds to a manufacturing step of a MOSFET, especially around its gate electrode.

Now, the conventional manufacturing steps will be explained with reference to FIGS. 3(a)–3(f). At first, a gate insulation film 2 is formed on a silicon substrate 1. A poly-crystalline silicon film 3 is laminated on the gate insulation film 2 by, for example, a CVD method under reduced pressure at 650° C. Then, a heat treatment is conducted, e.g. at 900° C., for facilitating crystallization of the poly-crystalline film 3. Then, a wolfram silicide film (hereinafter referred to as "WSi film") 4 as a metal silicide film with high melting point is laminated on the poly-crystalline film 3, e.g. by a sputtering method (FIG. 3(a)). Then, the polycide film is patterned with a shape of a gate electrode and etched by a photo-etching technique (FIG. 3(b)). Then, a surface of the laminated film is oxidized at 800° to 1000° C., and the WSi film 4 is crystallized simultaneously to consume excessive silicon atoms in the WSi film 4 by oxidation. Up to this point, sheet resistance of the WSi film 4 has been lowered to 5 to 6 $\Omega/\square$ from sheet resistance of 40 to 50 $\Omega/\square$.

Then, an inter-layer insulation film 5 is formed on the entire surface (FIG. 3(c)). Then, side walls 6 are formed on the side faces of the polycide film (gate electrode) by etching back (FIG. 3(d)). Since an oxidizing film on a source region, a drain region and the gate electrode has been completely removed, an oxidizing film 7 is formed on the entire surface as the protection against ion implantation prosecuted later (FIG. 3(e)). The oxidizing film 7 is formed, for example, by oxidation at 800° to 1000° C. Then, a fundamental MOS structure is obtained by implanting impurity ions in the source region 8 and the drain region 9 (FIG. 3(f)). Then, the MOSFET is completed by disposing an electrode on each region.

According to the manufacturing method described above, the crystallized WSi film 4 exists on the top of the etched back gate electrode. When this construction is exposed to a high temperature oxidizing environment, the surface of the WSi film 4 is anomalously oxidized, which often causes strain accumulation in the WSi film 4 and its pealing off from the poly-crystalline silicon film 3. To avoid this, the anomalous oxidation is prevented by forming an amorphous structure on the surface of the WSi film 4 by ion implantation or injection prior to the oxidation, or by capping the gate electrode surface with an oxidizing film formed by a low temperature CVD method (under atmospheric pressure, under reduced pressure, or with plasma) at around 400° C. prior to the oxidation.

However, the former method tends to damage the exposed source and drain regions by the ion implantation and to cause leakage of the transistor. In the latter method, the cap oxidizing film once formed by the low temperature CVD method is heat treated at high temperature. This heat treatment causes shrinkage of the cap oxidizing film, which exerts stress to the WSi film 4. Though the stress may not cause pealing off of the WSi film 4, the stress may cause lowering of adhesive force of the WSi film 4 with the poly-crystalline silicon film 3. This weak adhesion of the WSi film 4 with the poly-crystalline silicon film 3 causes serious problems on the reliability of the semiconductor devices.

In view of the foregoing, an object of the present invention is to provide a method of manufacturing a highly reliable semiconductor device which is provided with a polycide electrode having a metal silicide film with high melting point which shows excellent adhesion with and does never peals off from the poly-crystalline silicon film 3.

SUMMARY OF THE INVENTION

The object of the present invention is achieved by a method of manufacturing a semiconductor device which uses a polycide film including a metal silicide film with high melting point laminated on a poly-crystalline silicon film for forming a gate electrode or wiring. The manufacturing method is comprised of: forming a silicon thin film by a CVD method at a film formation temperature of 550° C. or lower by using a source gas containing silane; laminating a metal silicide film at a film formation temperature of 500° C. or lower on the silicon thin film to form the polycide film; patterning and etching the polycide film to form a gate electrode; and heat treating and simultaneously crystallizing the silicon thin film and the metal silicide film after the former steps are over.

When the silicon thin film is formed, in case pure monosilane is used, the film formation temperature is 500° to 550° C. In case the source gas contains disilane, the film formation temperature is 470° to 550° C.

And, it is preferable to form a silicon nitride film at a temperature of 400° C. or lower after simultaneously crystallizing the silicon thin film and the metal silicide film.

It is possible to form the silicon nitride film at a temperature of 400° C. or lower over an entire surface of the semiconductor device or over the polycide film, after simultaneously crystallizing the silicon thin film and the metal silicide film, forming an insulation film on the entire surface of the crystallized polycide film, and forming side walls on side faces of the gate electrode formed of the polycide film by etch back.

The silicon nitride film may be formed by reactive sputtering, plasma CVD method or ECR plasma CVD method.

When the silicon thin film is formed from a source gas containing silane as a source of the poly-crystalline silicon film by the CVD method at a temperature of 550° C. or lower, the formed silicon thin film is a mixture of amorphous silicon and poly-crystalline silicon, so that the silicon thin film is referred to hereinafter as "amorphous-like polycrystalline silicon film". By forming the metal silicide film with high melting point on the amorphous-like poly-crystalline silicon film at a formation temperature of 500° C. or lower, patterning and etching as required the polycide film so as to form the gate electrode, and simultaneously crystallizing the amorphous-like poly-crystalline silicon film and the metal silicide film, the boundary between the amorphous-like poly-crystalline silicon film and the metal silicide film is in an amorphous condition, so that it facilitates forming through the crystallization process a region in which the amorphous-like poly-crystalline silicon film continuously changes to the metal silicide film in the direction of the thickness. Due to this, the basic adhesion of the metal silicide film with the amorphous-like poly-crystalline silicon film is improved.

And, by forming the side walls on the side faces of the polycide film (gate electrode) after the simultaneous crystallization, or after forming the insulation film over the entire surface of the polycide film after the simultaneous crystallization and etching back the insulation film, the silicon nitride film which shows anti-oxidation with little shrinkage at high temperature heat treatment is formed by reactive sputtering, plasma CVD or ECR plasma CVD at a temperature of 400° C. or lower. Thus, at least the source and the drain regions covered with the nitride film are not damaged by the ion-implantation when the ions are injected. And, since the silicon nitride cap film shows little shrinkage, excessive stress is not exerted to the silicide film when heat is applied later. Due to this, the adhesion of the metal silicide film with the poly-crystalline silicon film is not lowered and the reliability of the devices is effectively improved.

DETAILED DESCRIPTION OF THE PREFERRED EMBODIMENTS

Now, the present invention will be described in detail hereinafter with accompanied drawings which illustrate the preferred embodiments of the present invention.

FIGS. 1(a)–1(f) show a first embodiment of the method of manufacturing a semiconductor device according to the present invention by way of sectional views. In FIGS. 1(a)–1(f), each sectional view corresponds to a manufacturing step of a MOSFET, especially around its gate electrode.

At first, a gate insulation film 12 is formed on a silicon substrate 11. An amorphous-like poly-crystalline silicon film 13 is laminated on the gate insulation film 12. In the prior art, the poly-crystalline silicon film is formed, for example at a reaction temperature of 650° C. in a furnace, the internal pressure of which is reduced (several tens Pa), and a monosilane gas diluted with a helium gas (20%$SiH_4$/He) is fed to the furnace at a flow rate of 1 L (litter)/min. According to the present invention, the amorphous-like poly-crystalline silicon film 13 is formed at 500° to 550° C. in a furnace, the internal pressure of which is reduced (about 200 Pa), and a pure monosilane gas ($SiH_4$ 100%) is fed to the furnace at a flow rate of 1 L/min. The reaction temperature may be lowered to 470° to 550° C. when a disilane gas ($Si_2H_6$) is used. If the film is formed above 550° C., the poly-crystalline silicon film will be obtained, but not the amorphous-like poly-crystalline silicon film intended by the present invention. If the film is formed at a lower temperature, i.e. lower than 500° C. for the monosilane gas and lower than 470° C. for the disilane gas, the amorphous film with poor film quality will be obtained.

Then, a WSi film 14 is formed by sputtering. The WSi film 14 is formed, for example, by sputtering from a $WSi_{2.7}$ target under the pressure of 0.1 to several Pa in an Ar gas flow of several tens mL (milliliter)/min on a substrate kept at 200° C. (FIG. 1(a)). According to the prior art, crystallization of the poly crystalline silicon film is almost completed at this point by the heat treatment at 900° C. while the silicide film remains in an amorphous state. In contrast, according to the present invention, the amorphous silicide film is laminated on the amorphous-like poly-crystalline silicon film and many dangling bonds exist on the laminated film boundary. In addition to the sputtering method, a CVD method which uses a reaction of wolfram hexafluoride and monosilane may be adopted. In any CVD method, it is important to form the amorphous-like poly-crystalline silicon at 500° C. or lower. A formation temperature higher than 500° C. causes crystallization of the silicon film.

Figure 1A:
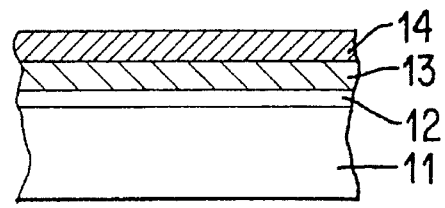
FIGS. 1(a) to 1(f) show a first embodiment of a method for manufacturing a MOSFET according to the present invention by way of sectional views.
Figure 1B:
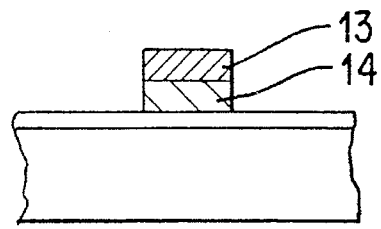

Then, the polycide film, i.e. lamination of the amorphous silicide film and the amorphous-like poly-crystalline silicon film, is patterned with a shape of a gate electrode and etched by the photo-etching technique (FIG. 1(b)).

Then, a surface of the polycide film is oxidized at 800° to 1000° C., and at the same time the amorphous-like poly-crystalline silicon film 13 and the WSi film 14 are simultaneously crystallized. Since the boundary between the amorphous-like poly-crystalline silicon film 13 and the WSi film 14 is more amorphous than that shown in the prior art, excessive silicon atoms in the WSi film 14 near the boundary are facilitated to bond with silicon atoms in the amorphous-like poly-crystalline silicon film 13 near the boundary in the course of crystallization, and a region is formed in which the amorphous-like poly-crystalline silicon film 13 continuously changes to the WSi film 14 through silicon-silicon bonding. Thus, the basic adhesion between the amorphous-like poly-crystalline silicon film 13 and the WSi film 14 is improved. Also, excessive silicon atoms inside the WSi film 14 are consumed by oxidation from its top surface similarly as in the prior art. Thus, a polycide electrode (gate electrode) which shows low resistivity and excellent adhesion is formed.

Figure 1C:
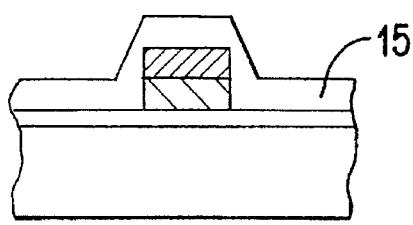
Figure 1D:
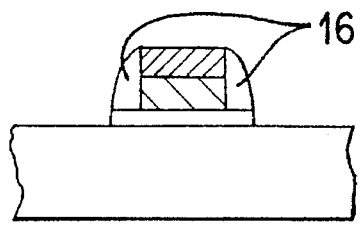
Figure 1E:
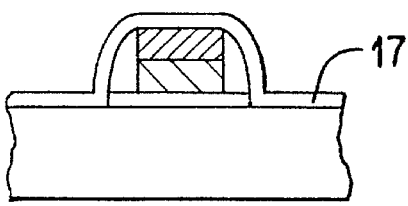
Figure 1F:
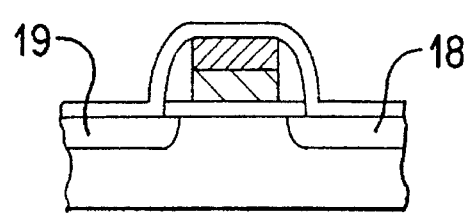

Thereafter, an inter-layer insulation film 15 is formed on the entire surface (FIG. 1(c)). Then, side walls 16 are formed on the side faces of the gate electrode by etching back (FIG. 1(d)). Then, an oxidizing film 17 is formed on the entire surface as the protection against ion implantation or injection (FIG. 1(e)). Then, a fundamental MOS structure is obtained similarly as in the prior art by implanting impurity ions in a source region 18 and a drain region 19 (FIG. 1(f)). Thereafter, a MOSFET is completed by disposing an electrode on each region through a window opened by the photo-etching technique.

The crystallized WSi film 14 exists on the gate electrode. Though strain may accumulate by the anomalous oxidation in a high temperature oxidizing environment in the crystallized WSi film 14, the crystallized WSi film 14 does not peal off by the heat treatment from the amorphous-like poly-crystalline silicon film 13 by virtue of the improved adhesion. Therefore, it is not necessary to prevent the anomalous oxidation by forming an amorphous surface on the WSi film 14 by ion-implantation, or by forming an oxidizing film cap by the low temperature CVD method in advance to the oxidation.

Though the first embodiment of the present invention described above is effective when the width of the polycide electrode is 0.6 μm or more, pealing off occurs when the width of the polycide electrode is less than 0.5 μm because of too narrow adhering area.

FIGS. 2(a)–2(f) show a second embodiment of a method for manufacturing a semiconductor device, i.e. MOSFET, according to the present invention by way of sectional views. The second embodiment prevents the pealing off in any occasion and further improves reliability of the semiconductor devices.

At first, a gate insulation film 12 is formed on a silicon substrate 11. An amorphous-like poly-crystalline silicon film 13 is laminated on the gate insulation film 12. Then, a WSi film 14 is formed by sputtering on the amorphous-like poly-crystalline silicon film 13 (FIG. 2(a)). Then, the polycide film is patterned with a shape of a gate electrode and etched by the photo-etching technique (FIG. 2(b)). Then, a surface of the polycide film is oxidized at high temperature, and at the same time the amorphous-like poly-crystalline silicon film 13 and the WSi film 14 are simultaneously crystallized. Then, an inter-layer insulation film 15 is formed on the entire surface (FIG. 2(c)). Then, side walls 16 are formed on the side faces of the gate electrode by etching back (FIG. 2(d)). The steps as shown in FIGS. 2(a) to 2(d) are the same as the steps shown in FIGS. 1(a) to 1(d) of the first embodiment.

Figure 2A:
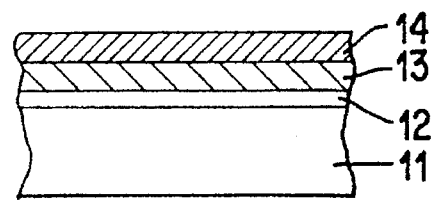
FIGS. 2(a) to 2(f) show a second embodiment of a method for manufacturing a MOSFET according to the present invention by way of sectional views.
Figure 2B:
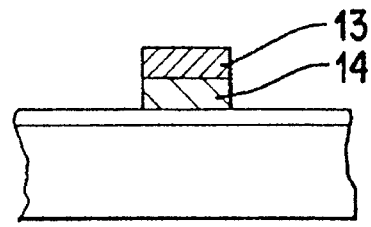
Figure 2C:
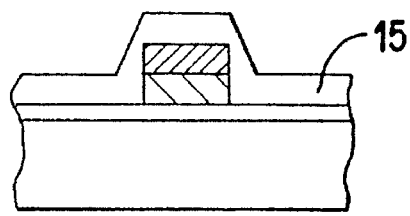
Figure 2D:
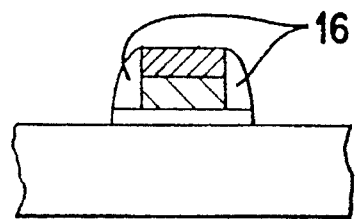
Figure 2E:
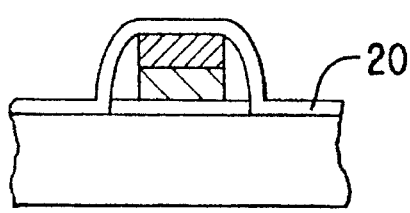

In place of forming the oxidizing protection film 17, a silicon nitride film 20, which shows excellent anti-oxidation property and low film shrinkage in high temperature heat treatment, is formed on the entire surface by reactive sputtering at a reaction temperature less than 400° C. for a thickness of 100 to 1000 Å (FIG. 2(e)). The reaction sputtering is conducted, for example, by using a silicon target and feeding a nitrogen gas and an argon gas at a flow rate of several to several tens mL/min under the pressure of 0.1 to several Pa and at a substrate temperature of about 200° C. The silicon nitride film 20 may be formed by a plasma CVD method or by an ECR plasma CVD method. In the ECR plasma CVD method, for example, $SiH_4$ and a nitrogen gas are fed at a flow rate of several to several tens mL/min under the pressure of 0.1 to several Pa, by supplying microwave power of 300 to 900 W, so that the silicon nitride film is formed at about 200° C. Since the silicon nitride film is formed at a low temperature, i.e. 400° C. or less, and under reduced pressure in these film formation methods, the surface of the silicide film is not oxidized during its formation.

Figure 2F:
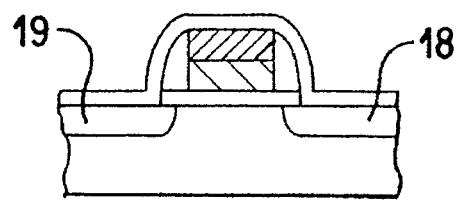
Figure 3A:
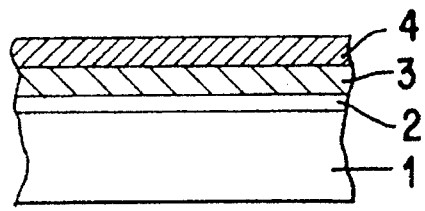
FIGS. 3(a) to 3(f) show a manufacturing method for a MOSFET according to the prior art by way of sectional views.
Figure 3B:
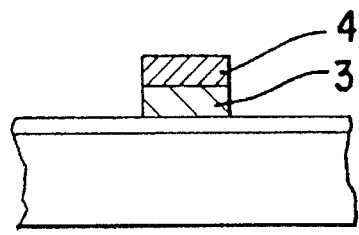
Figure 3C:
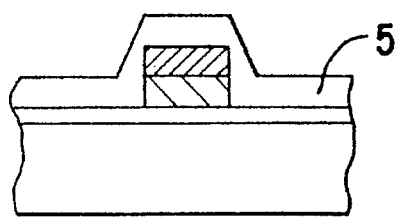
Figure 3D:
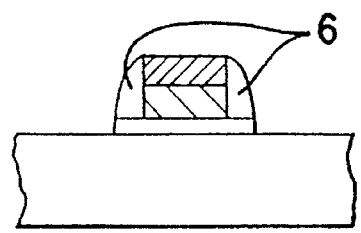
Figure 3E:
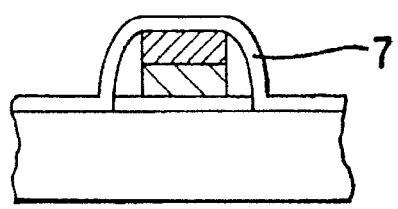
Figure 3F:
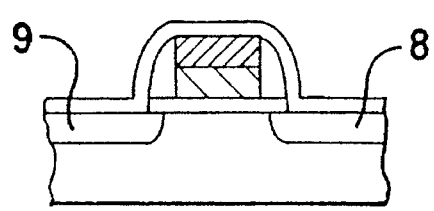

Thereafter, a fundamental MOS structure is obtained similarly as in the prior art by implanting impurity ions in a source region 18 and a drain region 19 (FIG. 2(f)). Then, a MOSFET is completed by forming the electrodes on the respective regions.

Since the silicon nitride film 20 remains on the source region and the drain region, it is unnecessary to deposit the oxidizing film over the entire surface for the implantation or injection of ions applied later. The remaining silicon nitride film 20 prevents the source region and the drain region from being damaged by the ion-implantation. Since the silicide film is capped with the highly anti-oxidizing silicon nitride film 20 which shows little shrinkage, the silicide film is neither oxidized nor subjected to excessive stress in the high temperature heat processing applied later, such as re-flow. Since the adhesion between the poly-crystalline silicon film and the metal silicide film with high melting point is not lowered, even a very fine polycide electrode of less than 0.5 μm in width is prevented from pealing off. Thus, the reliability of the devices is further improved.

In the above embodiments, the present invention has been explained by way of the application of the WSi film as silicide to the gate electrode, but the present invention can be embodied with other metal silicides with high melting point, such as molybdenum silicide, titanium silicide, etc. Also, the other metal silicides are applicable not only to the gate electrode but also to other electrodes or wiring.

In forming the gate electrode, wiring, etc. of polycide according to the present invention, after the amorphous-like poly-crystalline silicon film is formed as a source of the poly-crystalline silicon film from a monosilane gas or a disilane gas as a source gas, the metal silicide film with high melting point is formed thereon, and after the gate electrode, the wiring, etc. is formed by patterning and etching, the amorphous-like poly-crystalline silicon thin film and the metal silicide film are simultaneously crystallized. As a result, the boundary between the silicon thin film and the metal silicide film is brought into a highly amorphous state. This amorphous boundary between the amorphous-like poly-crystalline silicon film and the metal silicide film facilitates forming through the crystallization process a region in which the amorphous-like poly-crystalline silicon film continuously changes to the metal silicide film through silicon-silicon bonding. Due to this, the basic adhesion of the metal silicide film with the amorphous-like poly-crystalline silicon film is improved. According to the present invention, the silicide film does not peal off even if any additional measure is not taken for preventing the silicide film from pealing off, and the reliability of the semiconductor devices is improved.

Further, according to the present invention, the anti-oxidizing silicon nitride film which shows little shrinkage is formed to cap the polycide by reactive sputtering, plasma CVD method or ECR plasma CVD method at a temperature of 400° C. or lower, after the simulations crystallization of the amorphous-like poly-crystalline silicon thin film and the metal silicide film, or after forming the insulation film over the entire surface of the polycide film after the simultaneous crystallization and etching back the insulation film to thereby form the side walls on the side faces of the polycide film (gate electrode). Thus, the oxidation process for forming protective film for ion-implantation damage protection can be eliminated. Also, the silicide surface is not oxidized by the following high temperature procedure. And, since excessive stress is not exerted to the silicide film, even a fine polycide electrode of less than 0.5 μm in width is prevented from pealing off and the reliability of the semiconductor devices is further improved.

What is claimed is:

1. A method of manufacturing a semiconductor device, comprising, forming a partially poly-crystalline silicon thin film by a CVD method at a film formation temperature of 550° C. or lower by using a source gas containing silane;

laminating a metal silicide film at a film formation temperature of 500° C. or lower on said partially poly-crystalline silicon thin film to form a film lamination;

patterning and etching said film lamination; and heat treating said film lamination to simultaneously crystallize said partially poly-crystalline silicone thin film and said metal silicide film to integrally bond the patterned film lamination.

2. A method of manufacturing a semiconductor device as claimed in claim 1, wherein said partially poly-crystalline silicon thin film is a mixture of amorphous silicon and poly-crystalline silicon, and the metal silicide film and the partially poly-crystalline silicon thin film are crystallized so that a boundary between the partially poly-crystalline silicon thin film and the metal silicide film becomes, through the crystallization process, a region in which silicon gradually changes to silicide to thereby increase bonding strength.

3. A method of manufacturing a semiconductor device as claimed in claim 2, wherein said source gas is formed of pure monosilane and said film formation temperature is 500° to 550° C.

4. A method of manufacturing a semiconductor device as claimed in claim 2, wherein said source gas contains disilane and said film formation temperature is 470° to 550° C.

5. A method of manufacturing a semiconductor device as claimed in claim 2, further comprising forming a silicon nitride film at a temperature of 400° C. or lower after said silicon film and metal silicide film are crystallized.

6. A method of manufacturing a semiconductor device as claimed in claim 2, further comprising, forming an insulation film over the crystallized film lamination, etching back said insulation film to form side walls on side faces of said film lamination; and forming a silicon nitride film at a temperature of 400° C. or lower.

7. A method of manufacturing a semiconductor device as claimed in claim 5, wherein said silicon nitride film is formed by reactive sputtering.

8. A method of manufacturing a semiconductor device as claimed in claim 5, wherein said silicon nitride film is formed by plasma CVD.

9. A method of manufacturing a semiconductor device as claimed in claim 5, wherein said silicon nitride film is formed by ECR plasma CVD.

10. A method of manufacturing a semiconductor device as claimed in claim 1, wherein said partially poly-crystalline silicon thin film is formed on a substrate with a gate insulation film thereon.

* * * * *

UNITED STATES PATENT AND TRADEMARK OFFICE
CERTIFICATE OF CORRECTION

PATENT NO. : 5,618,755
DATED : April 8, 1997
INVENTOR(S) : Naoki Ito

It is certified that error appears in the above-indentified patent and that said Letters Patent is hereby corrected as shown below:

In column 1, line 21, change "3(a)-3(f) shows" to --3(a)-3(f) show--; and

In column 6, line 39, change "simulations" to --simultaneous--.

Signed and Sealed this

Twelfth Day of August, 1997

BRUCE LEHMAN

Attest:

Attesting Officer

Commissioner of Patents and Trademarks